(12) United States Patent
Osaka

(10) Patent No.: US 9,280,054 B2
(45) Date of Patent: Mar. 8, 2016

(54) ILLUMINATION OPTICAL SYSTEM, EXPOSURE APPARATUS, AND METHOD OF MANUFACTURING DEVICE

(75) Inventor: Noboru Osaka, Utsunomiya (JP)

(73) Assignee: CANON KABUSHIKI KAISHA, Tokyo (JP)

(*) Notice: Subject to any disclaimer, the term of this patent is extended or adjusted under 35 U.S.C. 154(b) by 839 days.

(21) Appl. No.: 13/371,637

(22) Filed: Feb. 13, 2012

(65) Prior Publication Data

US 2012/0212724 A1 Aug. 23, 2012

(30) Foreign Application Priority Data

Feb. 22, 2011 (JP) ................................ 2011-036334

(51) Int. Cl.
G03B 27/54 (2006.01)
G03F 7/20 (2006.01)

(52) U.S. Cl.
CPC .......... G03F 7/7005 (2013.01); G03F 7/70075 (2013.01); G03F 7/70208 (2013.01)

(58) Field of Classification Search
CPC .............. G03F 7/7005; G03F 7/70075; G03F 7/70208; G03F 7/70016; G03F 7/70025
USPC ................ 355/46, 52, 53, 55, 67–71, 77; 250/492.1, 492.2, 492.22, 493.1, 548
See application file for complete search history.

(56) References Cited

U.S. PATENT DOCUMENTS

| | | | |
|---|---|---|---|
| 4,682,885 A | | 7/1987 | Torigoe |
| 4,939,630 A | * | 7/1990 | Kikuchi et al. ............... 362/268 |
| 5,153,773 A | * | 10/1992 | Muraki et al. ................ 359/619 |
| 5,218,660 A | * | 6/1993 | Omata .......................... 385/116 |
| 5,517,000 A | * | 5/1996 | Nishiwaki et al. ........ 219/121.77 |
| 5,661,837 A | * | 8/1997 | Yamamoto et al. ........... 385/115 |
| 6,051,842 A | * | 4/2000 | Yamamoto .................... 250/548 |

(Continued)

FOREIGN PATENT DOCUMENTS

| | | |
|---|---|---|
| JP | 3-171614 A | 7/1991 |
| JP | 04225514 A | 8/1992 |

(Continued)

OTHER PUBLICATIONS

English translation of JP2010-134185, published on Jun. 17, 2010.*

(Continued)

*Primary Examiner* — Christina Riddle

(74) *Attorney, Agent, or Firm* — Rossi, Kimms & McDowell LLP

(57) ABSTRACT

An illumination optical system comprises plural rod integrators, a combining optical system and a light transmission unit. The rod integrators uniformize light intensity distributions of the light beams. The combining optical system combines the light beams emitted from the rod integrators, so that the light beams are adjacent to each other in cross-sections thereof. The light transmission unit has an entrance plane and an exit plane, divides the light beam combined by the combining optical system into plural light beams on the entrance plane, joins the divided light beams so that a cross-sectional shape of a joined pattern of the light beams on the exit plane is different from a cross-sectional shape of a joined pattern of the light beams on the entrance plane, and transfers each of the light beams from the entrance plane to the exit plane using plural optically coupled light pipes.

11 Claims, 13 Drawing Sheets

(56) References Cited

U.S. PATENT DOCUMENTS

| | | | |
|---|---|---|---|
| 6,585,524 B2* | 7/2003 | Robinson et al. | 439/54 |
| 6,795,169 B2* | 9/2004 | Tanaka et al. | 355/67 |
| 2004/0104359 A1* | 6/2004 | Komatsuda et al. | 250/492.2 |
| 2005/0134825 A1* | 6/2005 | Schuster | 355/71 |
| 2009/0251676 A1* | 10/2009 | Komori et al. | 355/71 |
| 2010/0309440 A1* | 12/2010 | Yamagishi et al. | 353/37 |

FOREIGN PATENT DOCUMENTS

| | | |
|---|---|---|
| JP | 4-078002 B | 12/1992 |
| JP | 07263312 A | 10/1995 |
| JP | 11354424 A | 12/1999 |
| JP | 2000-164487 A | 6/2000 |
| JP | 2001033875 A | 2/2001 |
| JP | 2001242326 A | 9/2001 |
| JP | 2002184676 A | 6/2002 |
| JP | 2004022708 A | 1/2004 |
| JP | 2010134185 A * | 6/2010 |
| TW | 200523685 A | 7/2005 |
| TW | 201022829 A1 | 6/2010 |

OTHER PUBLICATIONS

Taiwanese Office Action for corresponding TW101105097, mail date Apr. 22, 2014. English translation provided.

* cited by examiner

F I G. 3A
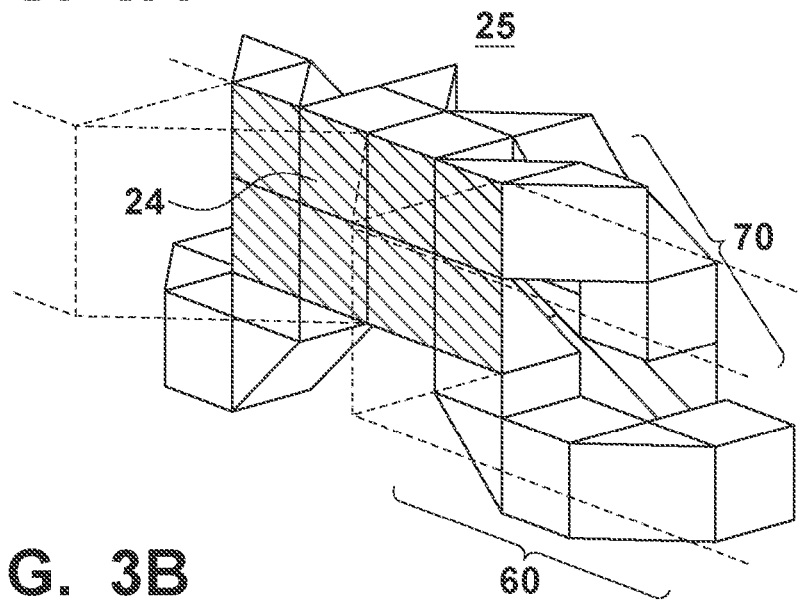
F I G. 3B
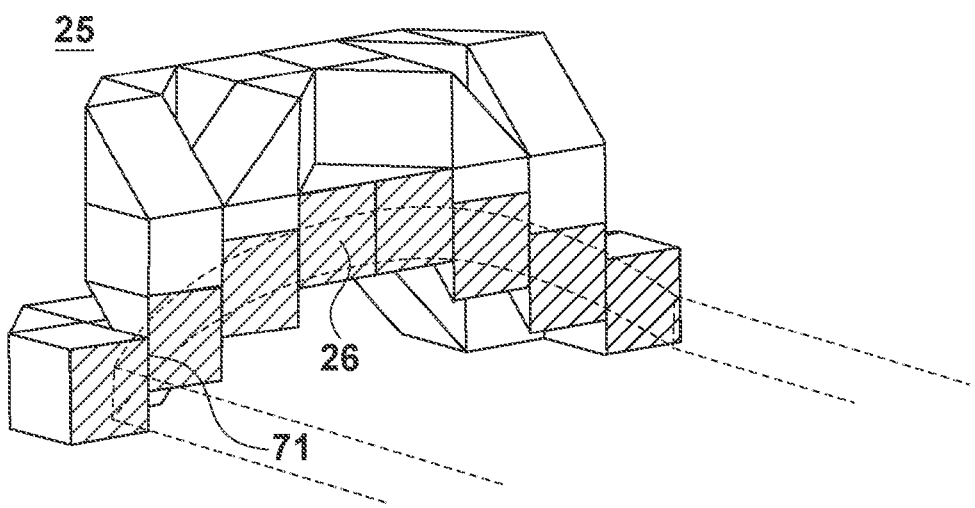
F I G. 3C
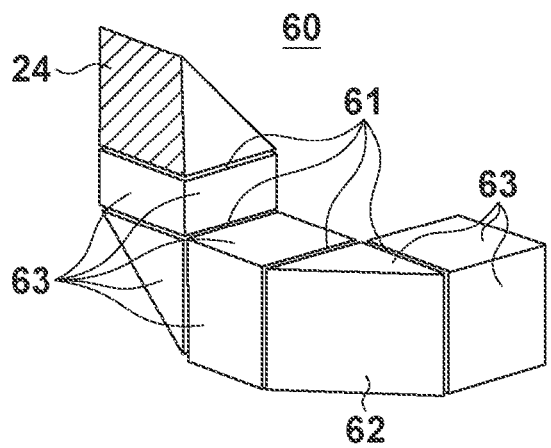

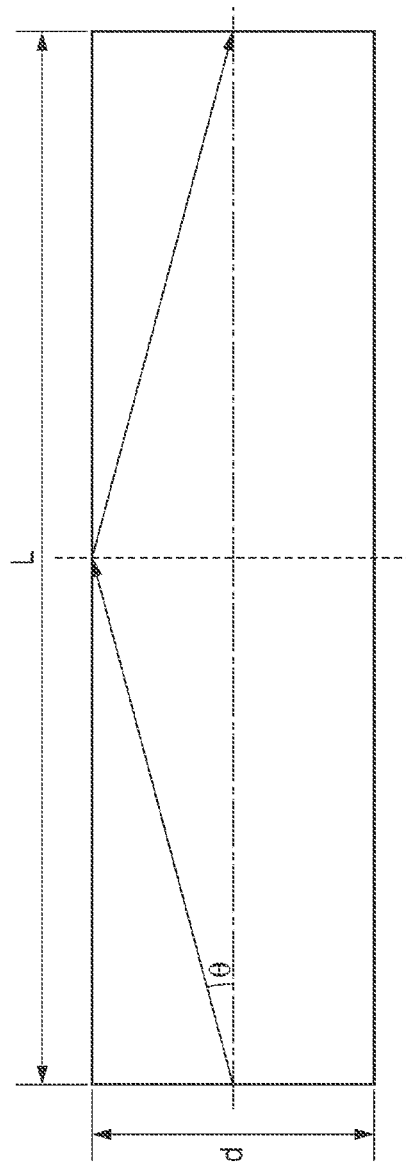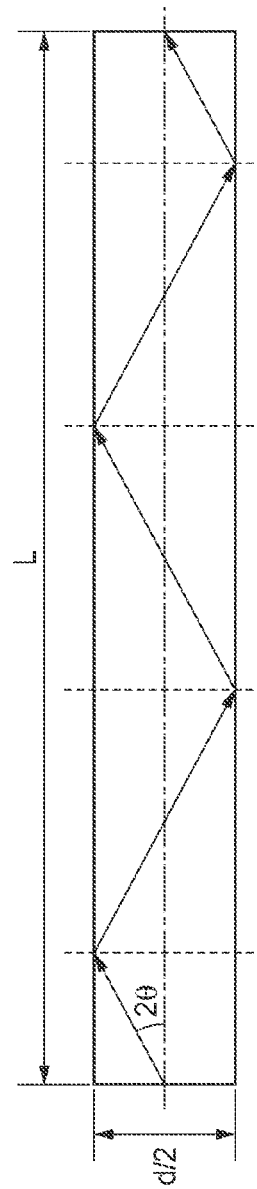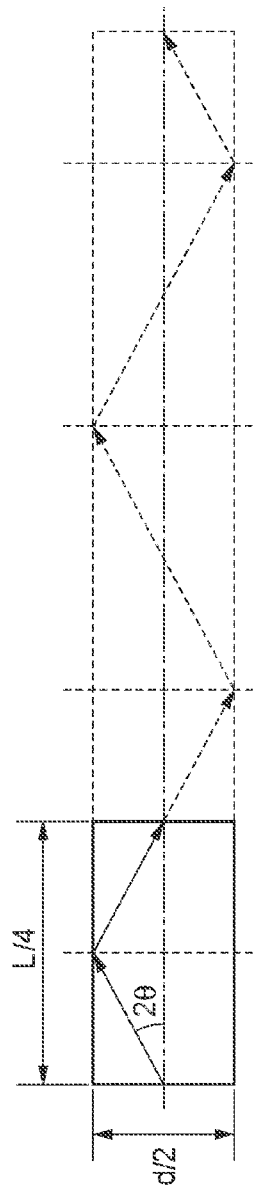

ILLUMINATION OPTICAL SYSTEM, EXPOSURE APPARATUS, AND METHOD OF MANUFACTURING DEVICE

BACKGROUND OF THE INVENTION

1. Field of the Invention

The present invention relates to an illumination optical system, an exposure apparatus, and a method of manufacturing a device.

2. Description of the Related Art

In a lithography process, that is, a process of manufacturing, for example, a semiconductor device or a liquid crystal display device, an exposure apparatus transfers the pattern of an original (reticle or mask) onto a photosensitive substrate (for example, a wafer or glass plate having a resist layer formed on its surface) via a projection optical system. In recent years, as a projection exposure apparatus which transfers a pattern to, for example, a liquid crystal display device, an exposure apparatus which transfers a pattern having a larger area on a mask onto a substrate by full-field exposure is required. To meet this requirement, a step-and-scan type scanning exposure apparatus capable of obtaining a high resolution and transferring a large area has been proposed.

This scanning exposure apparatus transfers a pattern illuminated with a slit light beam onto a substrate by a scanning operation via a projection optical system. Such an apparatus that scans using arcuated light is available. In this type, a projection optical system is present between a first object having a pattern to be transferred, and a second object onto which the pattern is to be transferred, and an exposure process is performed in an arcuated exposure region using only a specific off-axis image point of the projection optical system.

At this time, to illuminate the first object with arcuated light, an illumination optical system described in Japanese Patent Publication No. 4-78002, for example, can be used. This illumination optical system employs a method of guiding a light beam emitted by a light source so that its cross-sectional shape becomes a rectangular shape at a position optically conjugate to that of the first object serving as a surface to be illuminated, and extracting an arcuated illumination distribution using an arcuated opening member from a region illuminated in a rectangular shape. However, the arcuated illumination distribution extraction scheme described in Japanese Patent Publication No. 4-78002 makes it impossible to use light other than the arcuated opening as exposure light. Hence, the light use efficiency is low, and it is difficult to increase the illuminance on the surface to be illuminated of the illumination optical system even when the output of the light source is raised.

Japanese Patent Laid-Open No. 3-171614 to be described next makes an attempt to optically couple a plurality of light pipes to convert the cross-sectional shape of a light beam emitted by a light source into an arcuated shape, thereby improving the light use efficiency. However, these days, to comply with a demand for improvements in throughput and imaging performance in a lithography process, an illumination optical system which more uniformly illuminates the first object plane at a higher illuminance is required. An illumination optical system described in Japanese Patent Laid-Open No. 3-171614 can uniformly illuminate the first object as long as only one light source is used. However, because this illumination optical system uses only one light source, it has a limit in achieving high-illuminance illumination. To achieve high-illuminance illumination using the illumination optical system described in Japanese Patent Laid-Open No. 3-171614, a plurality of light sources can be used. However, in this case, when, for example, the outputs of the light sources vary with time, and a difference in output therefore occurs between the light sources, a variation may occur in the illuminance distribution on the first object serving as a surface to be illuminated, thus making uniform illumination impossible. Also, Japanese Patent Laid-Open No. 3-171614 shows an embodiment in which an illuminance variation is reduced by increasing the dimension of each arcuated light pipe in the direction in which light travels, but it is difficult to manufacture such a long arcuated light pipe. Furthermore, when long light pipes are used, the size of the overall illumination optical system increases.

Japanese Patent Laid-Open No. 2000-164487 describes an illumination optical system which combines light beams, emitted by a plurality of light sources 1*a* and 1*b*, using prisms 8*a* and 8*b* and uniformizes the light intensity distribution of the combined light beam using a rod integrator 4, as shown in FIG. 16. The use of this illumination optical system makes it possible to uniformly illuminate a first object (a surface to be illuminated) 6 at a high illuminance using a plurality of light sources.

However, when the illumination optical system as described in Japanese Patent Laid-Open No. 2000-164487 is used, light incident on the rod integrator 4 has a nonuniform positional distribution. Hence, to achieve a uniform illuminance distribution on the first object 6 serving as a surface to be illuminated, the dimension of the rod integrator 4 in the direction in which light travels increases. As the rod integrator 4 gets longer, the size of the overall illumination optical system increases. Again, as the rod integrator 4 becomes longer, a larger light loss is generated upon internal absorption of the rod integrator 4 due to manufacturing errors resulting from factors such as the surface accuracy of the rod integrator 4 and the parallelism between its opposed surfaces, thus degrading the light use efficiency of the illumination optical system.

SUMMARY OF THE INVENTION

In view of this, the present invention provides a compact illumination optical system which uniformly illuminates a surface to be illuminated at a high illuminance.

The present invention in its one aspect provides an illumination optical system which illuminates a surface to be illuminated with a plurality of light beams emitted from a plurality of light sources, the system comprising: a plurality of rod integrators which uniformize light intensity distributions of the plurality of light beams emitted from the plurality of light sources; a combining optical system which combines the plurality of light beams emitted from the plurality of rod integrators, so that the plurality of light beams are adjacent to each other in cross-sections thereof; and a light transmission unit which has an entrance plane and an exit plane, divides the light beam combined by the combining optical system into a plurality of light beams on the entrance plane, joins the plurality of divided light beams so that a cross-sectional shape of a joined pattern of the plurality of divided light beams on the exit plane is different from a cross-sectional shape of a joined pattern of the plurality of divided light beams on the entrance plane, and transfers each of the plurality of divided light beams from the entrance plane to the exit plane using a plurality of optically coupled light pipes.

Further features of the present invention will become apparent from the following description of exemplary embodiments with reference to the attached drawings.

BRIEF DESCRIPTION OF THE DRAWINGS

FIGS. 3A to 3C are schematic views of a light transmission unit in the first embodiment;

FIGS. 12A to 12C are schematic views of rod integrators;

DESCRIPTION OF THE EMBODIMENTS

Embodiments of the present invention will be described below with reference to, for example, the accompanying drawings.

[First Embodiment]

Figure 1:
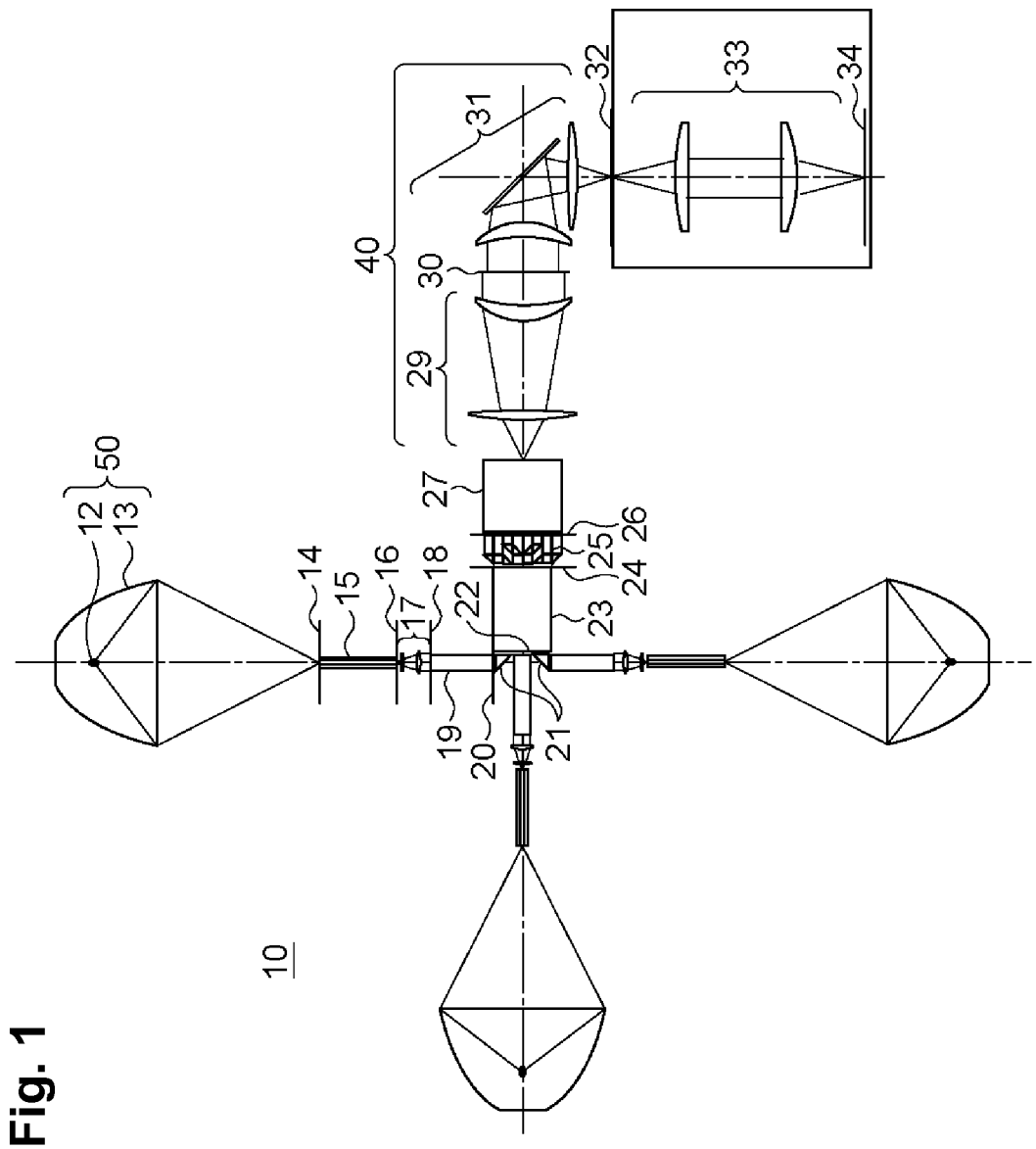
FIG. 1 is a schematic view of an illumination optical system according to the first embodiment.

An illumination optical system according to the first embodiment will be described with reference to FIG. 1. An illumination optical system 10 according to the first embodiment illuminates a surface to be illuminated with a plurality of light beams emitted from a plurality of light sources, and is mounted in, for example, an exposure apparatus. The illumination optical system 10 guides a plurality of light beams emitted by a plurality of (three) light source units 50 onto a mask (original) 34 which serves as a surface to be illuminated and has a pattern formed on it. The illumination optical system 10 includes a first rod optical system 15, a first optical system 17, a second rod optical system 19, a combining optical system 21, a third rod optical system 23, a light transmission unit 25, a fourth rod optical system 27, an imaging optical system 40, a slit 32, a fourth optical system 33, and the mask 34. The imaging optical system 40 includes a second optical system 29, aperture stop 30, and third optical system 31. A high-pressure mercury lamp is used as a light source 12. Each of the three light source units 50 includes a light source 12 and an elliptical mirror 13. A xenon lamp or an excimer laser, for example, can also be used as the light source 12. The elliptical mirror 13 serves as a condensing optical system for converging light emitted by the light source 12, and has a shape corresponding to part of an elliptical shape. The light source 12 is located at one focal position of the ellipse. Light which is emitted by the light source 12 and reflected by the elliptical mirror 13 is focused on the other focal position of the ellipse. In this embodiment, an entrance plane 14 of the first rod optical system 15 is located at the other focal position of the ellipse.

Figure 2A:
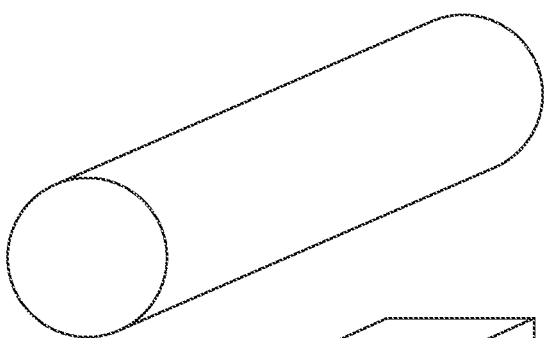
FIGS. 2A to 2D are schematic views of first rod integrators.
Figure 2B:
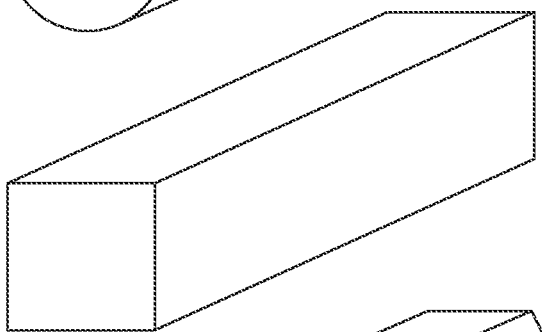
Figure 2C:
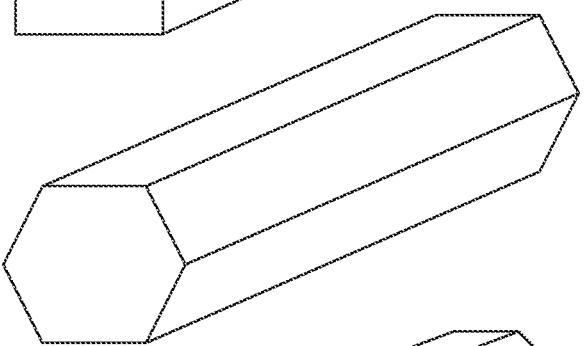
Figure 2D:
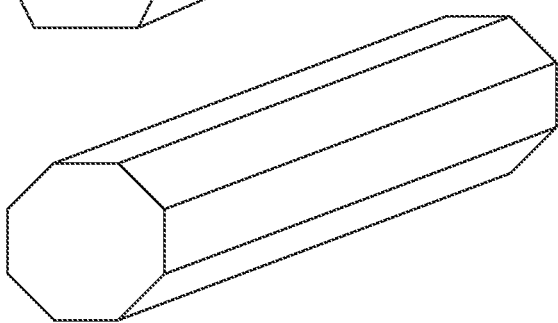

The first rod optical system 15 serves as a rod integrator having, for example, a hexagonal cross-section, as shown in FIG. 2C, and can be made of synthetic quartz. A light beam incident on the first rod optical system 15 is reflected a plurality of times by its inner surface while being transmitted through its interior, and reaches an exit plane 16. As a result, even if the light intensity distribution on, for example, the entrance plane 14 is nonuniform, it is uniformized upon reflection of the light beam a plurality of times, so the light beam has a uniform light intensity distribution on the exit plane 16. Instead of a rod integrator having a hexagonal cross-section, a rod integrator having a circular cross-section as shown in FIG. 2A, a quadrangular cross-section as shown in FIG. 2B, or an octagonal cross-section as shown in FIG. 2D may be used as the first rod optical system 15. The light beam emerging from the exit plane 16 is guided onto an entrance plane 18 of the second rod optical system 19 by the first optical system 17. At this time, the first optical system 17 is located so that the entrance plane 18 is substantially the Fourier transform plane of the exit plane 16. The second rod optical system 19 serves as a quadrangular prismatic rod integrator having, for example, a quadrangular cross-section, and can be made of synthetic quartz. A light beam incident on the second rod optical system 19 is reflected a plurality of times by its inner surface while being transmitted through its interior, and reaches an exit plane 20. As a result, even if the light intensity distribution on, for example, the entrance plane 18 is nonuniform, it is uniformized upon reflection of the light beam by a plurality of times, so the light beam has a uniform light intensity distribution on the exit plane 20.

Light beams from the three light source units 50 are combined so that their cross-sectional shapes are adjacent to each other by the combining optical system 21 formed by two prisms, and are incident on an entrance plane 22 of the third rod optical system 23. The third rod optical system 23 serves as a quadrangular prismatic rod integrator having, for example, a quadrangular cross-section, and can be made of synthetic quartz. The light beam incident on the third rod optical system 23 is reflected a plurality of times by its inner surface while being transmitted through its interior, and reaches an exit plane 24. When, for example, light beams which are emitted by the three light source units 50 and incident on the entrance plane 22 have different light intensities, the light intensity distribution on the entrance plane 22 is nonuniform. However, the light intensity distribution on the entrance plane 22 is uniformized upon reflection of the light beam a plurality of times in the third rod optical system 23, so the light beam has a uniform light intensity distribution on the exit plane 24.

The light beam emerging from the exit plane 24 is incident on the light transmission unit 25. The light transmission unit 25 has a configuration obtained by optically coupling pluralities of light pipes and deflecting prisms, as shown in FIG. 3C. A hatched portion in FIG. 3A indicates the exit plane 24, and that in FIG. 3B indicates an exit plane 26. The light beam combined by the combining optical system 21 is divided into a plurality of (eight) light beams on the exit plane 24. The divided light beams pass through eight different paths in the light transmission unit 25 through the pluralities of optically coupled light pipes and deflecting prisms, and reach the exit plane 26. Light pipes and deflecting prisms which are equal in total number are located in each of the eight paths, so the optical path lengths of the eight divided light beams in the light transmission unit 25 are equal to each other. The eight divided light beams are joined on the exit plane 26 so that the cross-sectional shape of a joined pattern of these eight light beams on the exit plane 26 is different from that on the exit plane 24. In this embodiment, the joined pattern of the eight light beams has a quadrangular cross-sectional shape on the exit plane 24, and has a nearly arcuated cross-sectional shape on the exit plane 26, as shown in FIGS. 3A and 3B. Note that the periphery of the light transmission unit 25 is covered with the air. Hence, when the light used has a wavelength of 200 nm to 500 nm, and the light pipes and deflecting prisms are made of quartz, a light beam incident on the exit plane 24 is totally reflected by the inner surface of the light transmission unit 25, independently of its incident angle. If mechanical contact may occur in part of the light transmission unit 25 upon holding of the light transmission unit 25, total reflection can be partially maintained by coating thin films having a refractive index lower than quartz on the side surfaces of the light pipes and deflecting prisms. However, it is desirable to coat an antireflection film on the light transmissive surface of the light transmission unit 25 so as to prevent the light pipes and deflecting prisms form coming into contact with each other on this surface.

FIG. 3C shows a transmission path 60 of one light beam in the light transmission unit 25. Light transmissive portions 61 are formed between the light pipes and the deflecting prisms as gaps with a width of several ten to several hundred micrometers to avoid their contact, as shown in FIG. 3C. Also, a surface 62 serves as the reflecting surface of a given deflecting prism, and is coated with a reflection film. Each surface 63 is coated with a thin film which is made of $MgF_2$ (magnesium fluoride) and has a thickness of about 10 µm. Each surface 63 can also be coated with a thin film made of a fluoride such as $LiF$ (lithium fluoride) or $CaF_2$ (calcium fluoride). For example, an MgF film has a refractive index of about 1.460 to 1.476 in the wavelength range of 300 nm to 500 nm. Assuming that the air has a refractive index of about 1, light incident on the exit plane 24 at an angle that falls below 27.45° can be totally reflected in the wavelength range of 300 nm to 500 nm.

Figure 4:
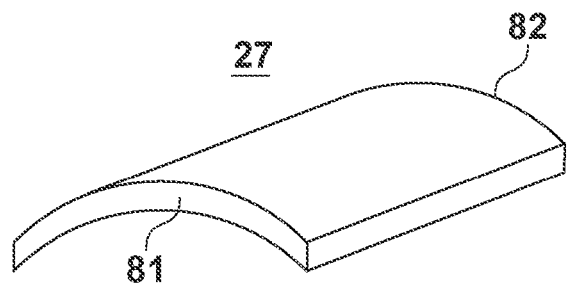
FIG. 4 is a schematic view of a rod integrator.

The light beam emerging from the exit plane 26 is incident on the fourth rod optical system 27. The fourth rod optical system 27 serves as a rod integrator having an entrance plane 81 and exit plane 82 with the same arcuated shape, as shown in FIG. 4. The light beam emerging from the exit plane 26 of the light transmission unit 25 desirably has a uniform distribution. However, although transmission paths 60 and 70 of the light transmission unit 25 shown in, for example, FIG. 3A are located adjacent to each other, a gap may be formed at a position 71 shown in FIG. 3B when the light transmission unit 25 is held actually. In this case, illumination light generates a streaked pattern (streaked variation) on the exit plane 26, and this streaked variation may result in an exposure variation at a specific position in, for example, an exposure apparatus. To reduce the streaked variation, the fourth rod optical system 27 is located so that its entrance plane 81 is close to the exit plane 26 of the light transmission unit 25.

The light beam incident on the entrance plane 81 of the fourth rod optical system 27 is reflected a plurality of times by its inner surface, and reaches the exit plane 82. As the light beam incident on the fourth rod optical system 27 is reflected a plurality of times by its inner surface, the light intensity distribution of this light beam is uniformized on the exit plane 82. Thus, a streaked variation generated on the exit plane 26 of the light transmission unit 25 can be reduced on the exit plane 82 of the fourth rod optical system 27. The light beam emerging from the exit plane 82 of the fourth rod optical system 27 passes through the second optical system 29, aperture stop 30, and third optical system 31, and reaches the slit 32. The second optical system 29 is located so that the position of the aperture stop 30 substantially corresponds to the Fourier transform plane of the exit plane 82 of the fourth rod optical system 27. Also, the third optical system 31 is located so that the position of the slit 32 substantially corresponds to the Fourier transform plane of the aperture stop 30. At this time, the position of the exit plane 82 of the fourth rod optical system 27 and that of the slit 32 are optically conjugate to each other.

Figure 5A:
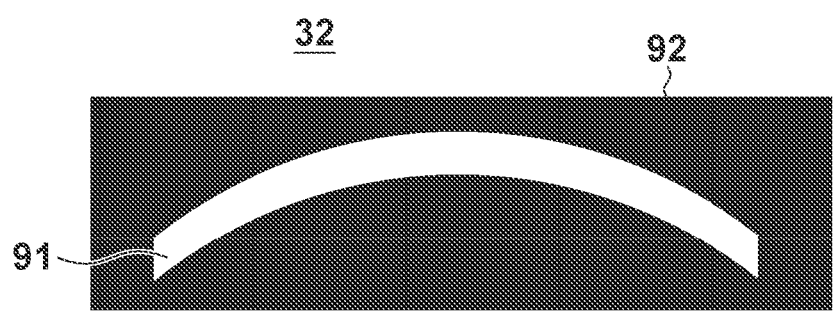
FIGS. 5A and 5B are schematic views of slits.

The light beam having passed through the slit 32 passes through the fourth optical system 33, and reaches the mask 34 serving as a surface to be illuminated. The fourth optical system 33 is formed by two sets of concave mirrors and two sets of plane mirrors so that the position of the slit 32 and that of the mask 34 are optically conjugate to each other. The slit 32 in this embodiment has an arcuated opening, as shown in FIG. 5A. The slit 32 includes an arcuated light transmissive portion 91 and a light-shielding portion 92. Note that the light transmissive portion 91 has a structure with a slit width that can change for each position. The arcuated region on the mask 34 at a position conjugate to that of the slit 32 can be illuminated with light having passed through the light transmissive portion 91.

In this embodiment, in illuminating the mask 34 upon combination of light beams emitted by the plurality of light sources 12, the third rod optical system 23 and fourth rod optical system 27 are located to reduce an illuminance variation on the mask 34 generated due to the difference in output between the individual light sources 12. To reduce the generated illuminance variation, it is necessary to increase the dimensions of the third rod optical system 23 and fourth rod optical system 27 in the direction in which light travels. However, in the illumination optical system 10 according to this embodiment, the first rod optical system 15 is located for each light source 12 to individually uniformize a light beam from this light source 12 on the entrance plane 22, so the third rod optical system 23 can be shortened. The principle according to which the third rod optical system 23 can be shortened will be explained with reference to FIGS. 6A to 6C.

Figure 6A:
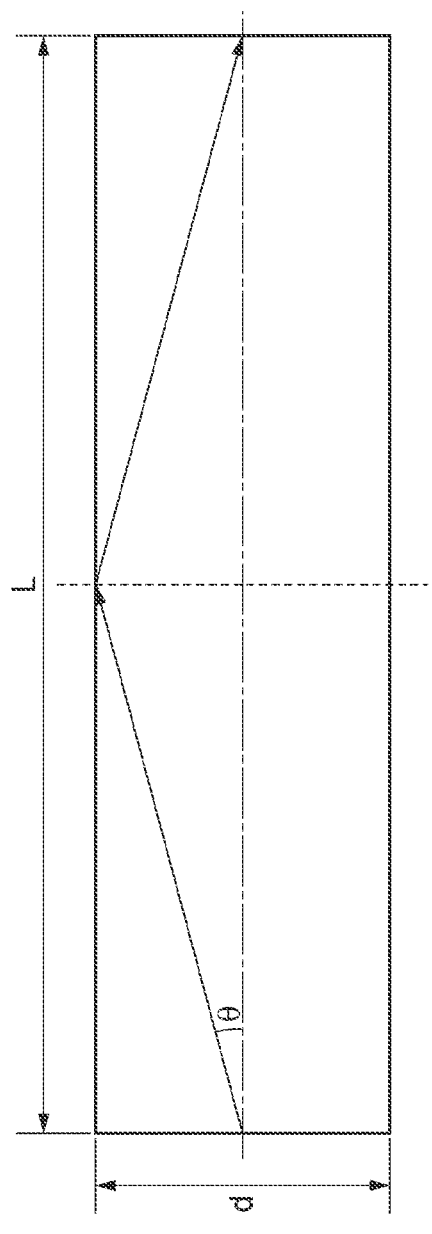
FIGS. 6A to 6C are views for explaining the technical significance of the first rod integrator.
Figure 6B:
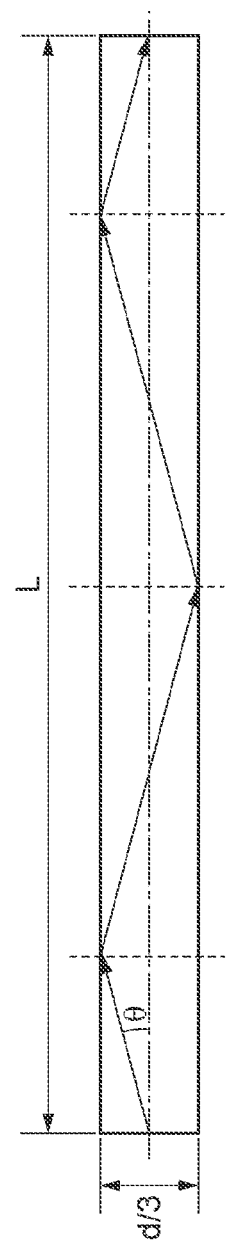

FIG. 6A shows light transmitted through the interior of a quadrangular prismatic rod integrator having a length L and a cross-section with a side length d, and an alternate long and short dashed line indicates the optical axis. Assume herein that light travels from the initial end face of the quadrangular prismatic rod integrator while being tilted at an angle θ with respect to the optical axis. This light beam is reflected by the inner surface of the quadrangular prismatic rod integrator at a position corresponding to a length L/2, and reaches the terminal end face of this rod integrator, as shown in FIG. 6A. On the other hand, FIG. 6B shows light transmitted through the interior of a quadrangular prismatic rod integrator having a cross-section with a side length d/3. Assume herein that light travels from the initial end face of the quadrangular rod integrator while being tilted at an angle θ with respect to the optical axis. This light beam is reflected by the inner surface of the quadrangular prismatic rod integrator at a position corresponding to a length L/6, and subsequently repeats its reflection for every length L/3. This light beam is reflected three times by the inner surface of the rod integrator having the length L until it finally reaches the terminal end face of this rod integrator.

Figure 6C:
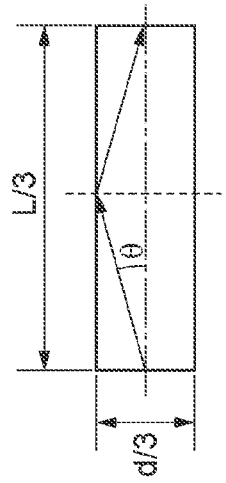

When a rod integrator is used to uniformize light, its dimension in the direction in which light travels is determined so that a light beam is reflected a plurality of times while it travels from its initial end face to its terminal end face. The larger the number of times of reflection, the greater the obtained uniformization effect becomes. Therefore, the uniformization effect is greater in the rod integrator shown in FIG. 6B than in that shown in FIG. 6A. In other words, to attain uniformization to the same degree as in FIG. 6A, a rod integrator having a length L/3 and a cross-section with a side length d/3, as shown in FIG. 6C, suffices.

As in the illumination optical system 10 according to this embodiment, when the first rod optical system 15 is located for each light source, light beams from these light sources are combined, and the combined light beam is guided to the third rod optical system 23, the light beam is partially uniformized for each light source before combination, so the third rod optical system 23 may be short. Also, according to the above-mentioned principle, the first rod optical system 15 has a rod width about ⅓ that of the third rod optical system 23, so uniformization in the first rod optical system 15 can decrease the total rod length.

Also, as described above, in this embodiment, the light intensity distribution is uniformized by locating the entrance plane 14 of the first rod optical system 15 at the other focal position of the ellipse. When, for example, the illumination optical system 10 according to this embodiment is mounted in an exposure apparatus, the intensity distribution of the above-mentioned uniformized light beam serves as an effective light source distribution. The effective light source distribution is a parameter deeply associated with the imaging performance of the exposure apparatus. Depending on the pattern to be transferred by projection exposure, a uniform light intensity distribution is desirably formed. Hence, in this embodiment, the first rod optical system 15 is used to uniformize the light intensity distribution. However, the illumination optical system 10 can be used as an illumination optical system even with no first rod optical system 15 is present. In this case, the illumination optical system 10 need only be formed so that the entrance plane 14 and exit plane 16 in this embodiment coincide with each other.

The numbers and arrangements of optical elements which constitute the first optical system 17 and imaging optical system 40 in this embodiment merely provide an example, and the present invention is not limited to this. Also, although not particularly referred to in the above description, an anti-reflection film is formed on the light transmissive surface of each optical element, and a reflection film is formed on each mirror. Moreover, although the illumination region for illuminating the mask 34 has an arcuated shape in this embodiment, this illumination region is not limited to an arcuated region.

[Second Embodiment]

Figure 7:
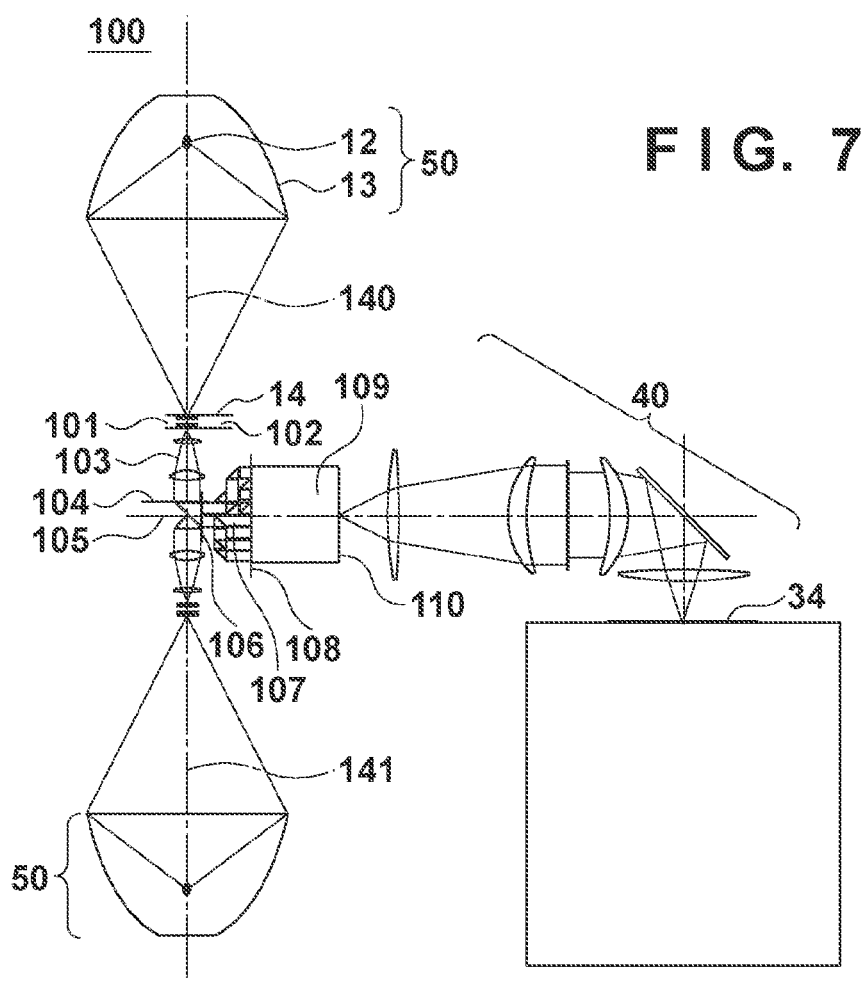
FIG. 7 is a schematic view of an illumination optical system according to the second embodiment.

The configuration of an illumination optical system according to the second embodiment will be described with reference to FIG. 7. In an illumination optical system 100 according to the second embodiment, the illumination region has, for example, a rectangular shape, and light beams emitted by two light source units 50 are guided onto a mask (original) 34 which serves as a surface to be illuminated and has a pattern formed on it. The illumination optical system 100 includes a fly-eye optical system 101, a first optical system 103, a combining optical system 105, a light transmission unit 107, a rod optical system 109, a slit 110, an imaging optical system 40, and the mask 34.

Figure 8:
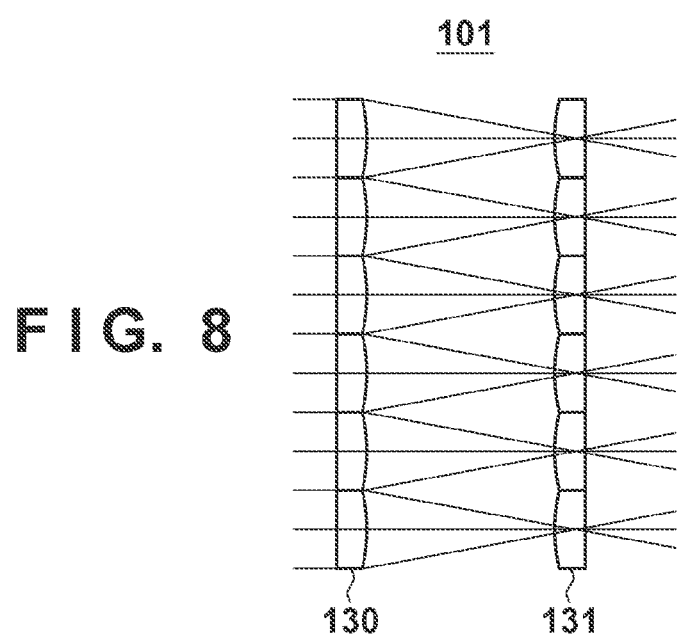
FIG. 8 is a schematic view of a fly-eye optical system.

FIG. 8 is a view showing the fly-eye optical system 101. The fly-eye optical system 101 is formed by two lens groups 130 and 131, each of which is formed by bonding a large number of planoconvex lenses in a flat shape, as shown in FIG. 8. The curved surfaces of the lens groups 130 and 131 are located to face each other so that a counterpart planoconvex lens is present at the focal position of each planoconvex lens which constitutes the lens groups 130 and 131. Using such a fly-eye optical system 101, a large number of secondary light source distributions equivalent to light sources 12 are formed at the position of an exit plane 102 of the fly-eye optical system 101. The light beam emerging from the exit plane 102 of the fly-eye optical system 101 is guided onto an entrance plane 104 of the combining optical system 105 by the first optical system 103. At this time, the first optical system 103 is located so that the entrance plane 104 is substantially the Fourier transform plane of the exit plane 102. Since a large number of secondary light source distributions are formed at the position of the exit plane 102, the light intensity distribution of the light beam incident on the entrance plane 104 of the combining optical system 105 is uniformized, thereby forming a uniform light intensity distribution on the entrance plane 104.

Figure 9A:
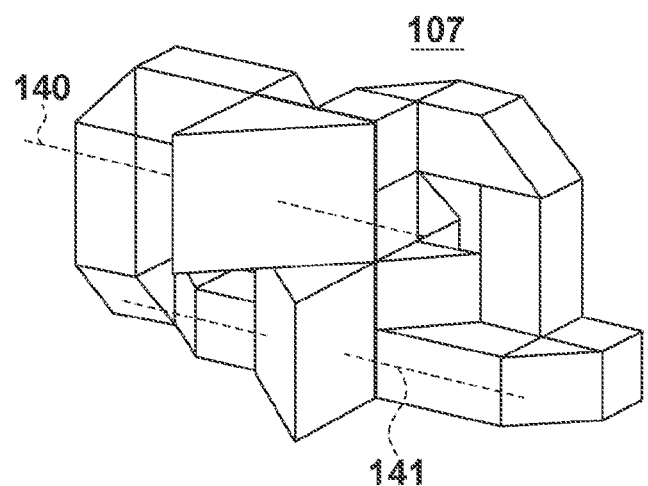
FIGS. 9A to 9C are schematic views of a combining unit and light transmission unit in the second embodiment.
Figure 9B:
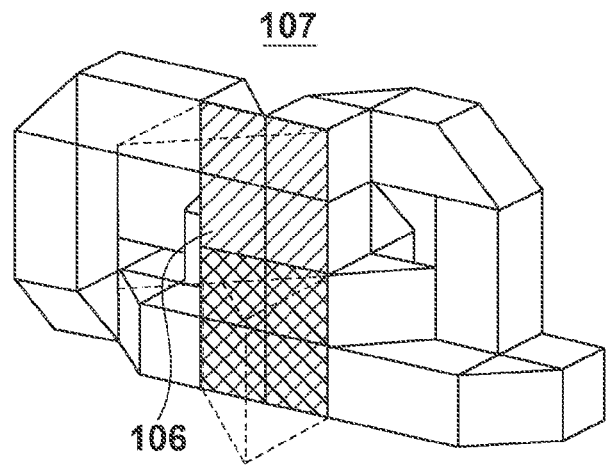
Figure 9C:
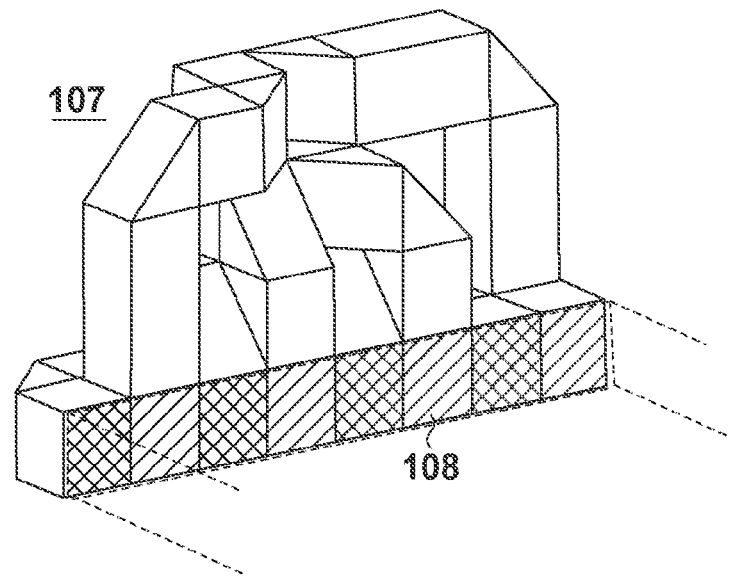

The arrangement of the combining optical system 105 and light transmission unit 107 will be described next with reference to FIGS. 9A to 9C. Light beams emitted by the light sources 12 are combined by the combining optical system 105 which uses two prisms, and the combined light beam is incident on the light transmission unit 107, as shown in FIG. 9A. At this time, the two prisms are located so optical axes 140 and 141 of the two light source units 50 do not coincide with each other. The light transmission unit 107 has a configuration obtained by coupling pluralities of light pipes and deflecting prisms, as shown in FIGS. 9B and 9C. A hatched portion in FIG. 9B indicates the region which receives a light beam coming from the light source unit 50 having the optical axis 140, and a dotted portion in FIG. 9B indicates the region which receives a light beam coming from the light source units 50 having the optical axis 141. Each of the light beams incident on the hatched portion and dotted portion in FIG. 9B is divided into four light beams to allow the divided light beams to pass through different paths in the light transmission unit 107 for each divided region, thereby converting these light beams so that their cross-sectional shapes on an exit plane 108 are different from those on an entrance plane 106, as shown in FIG. 9C. The light transmission unit 107 transfers incident light beams so that the regions (hatched portions) through which the light beams obtained by dividing the light beam on the optical axis 141 pass are positioned on the exit plane 108 between those (dotted portions) through which the light beams obtained by dividing the light beam on the optical axis 140 pass, as shown in FIG. 9C. The light transmission unit 107 can join, on the exit plane 108, the light beams divided by the entrance plane 106, so that the dotted portions and the hatched portions are arranged regularly, as shown in FIG. 9C.

Figure 5B:
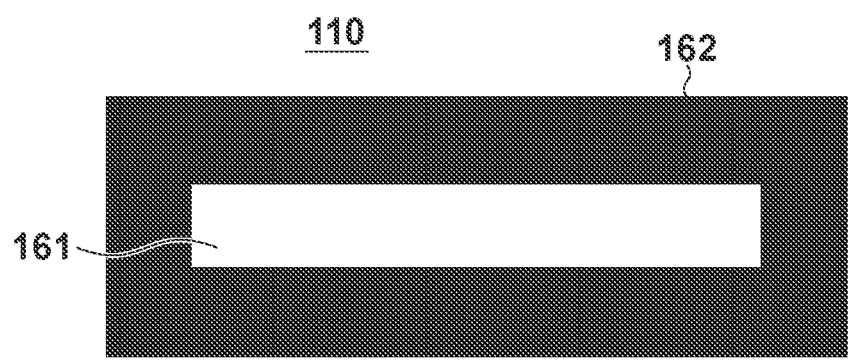

The light beam emerging from the exit plane 108 is incident on the rod optical system 109. A quadrangular prismatic rod integrator, for example, is used as the rod optical system 109. The light beam incident on the rod optical system 109 is reflected a plurality of times by its inner surface, and reaches the slit 110. Upon reflection of the light beam by a plurality of times by the inner surface of the rod optical system 109, a uniform light intensity distribution can be obtained in the slit 110 even if a light intensity variation is present on the exit plane 108 of the light transmission unit 107. The light beam emerging from the slit 110 is guided onto the mask 34 by the imaging optical system 40. At this time, the imaging optical system 40 is located so that the position of the slit 110 and that of the mask 34 are optically conjugate to each other. FIG. 5B shows the slit 110 used in this embodiment. The slit 110 includes a light transmissive portion 161 and light-shielding portion 162. The rectangular region on the mask 34 at a position conjugate to that of the slit 110 can be illuminated with light having passed through the rectangular light transmissive portion 161.

In this embodiment, in illuminating the mask 34 upon combination of light beams emitted by the plurality of light sources 12, the rod optical system 109 is located to reduce an illuminance variation on the mask 34 generated due to the difference in output between the individual light sources 12. To reduce the generated illuminance variation, it is necessary to increase the dimension of the rod optical system 109 in the direction in which light travels. However, as in the illumination optical system according to this embodiment, the dimension of the rod optical system 109 in the direction in which light travels can be decreased by alternately arraying, on the exit plane 108 of the light transmission unit 107, the regions through which the light beams obtained by dividing the light beam from each light source pass. This makes it possible to uniformly illuminate the mask 34 using a compact configuration. The numbers and arrangements of optical elements which constitute the first optical system 103 and imaging optical system 40 in this embodiment merely provide an example, and the present invention is not limited to this. Also, although not particularly referred to in the above description, an antireflection film is formed on the light transmissive surface of each optical element, and a reflection film is formed on each mirror.

[Third Embodiment]

Figure 10:
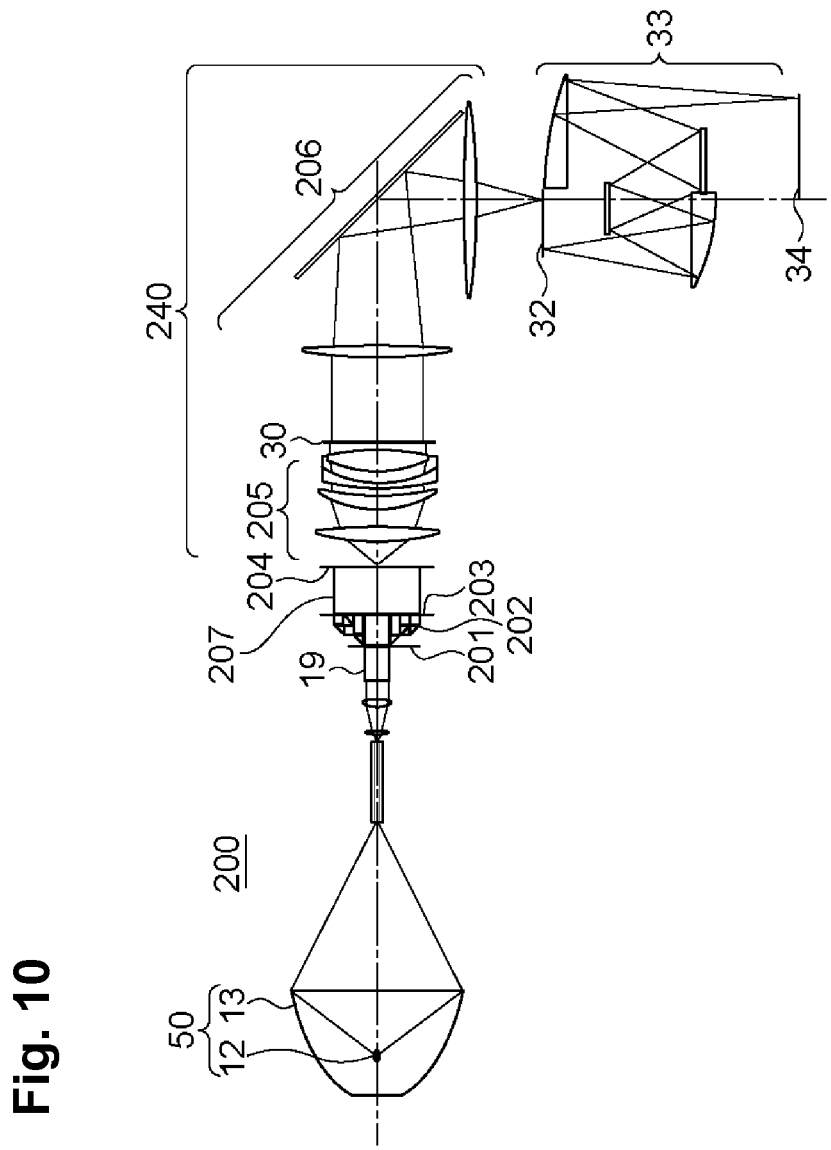
FIG. 10 is a schematic view of an illumination optical system according to the third embodiment.
Figure 11A:
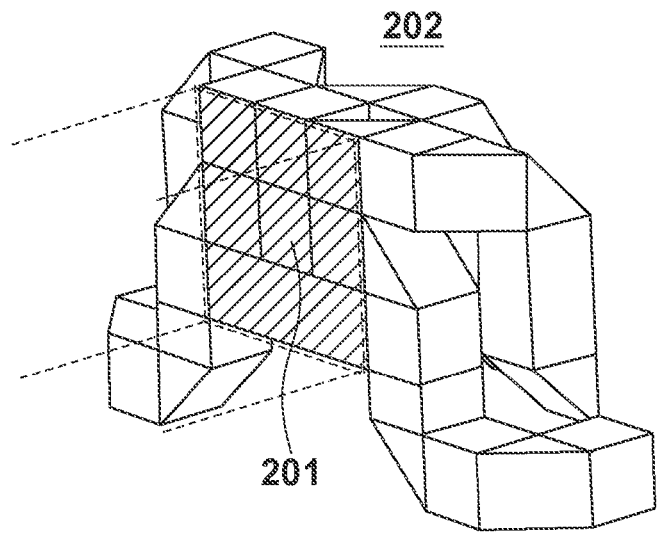
FIGS. 11A and 11B are schematic views of a light transmission unit in the third embodiment.
Figure 11B:
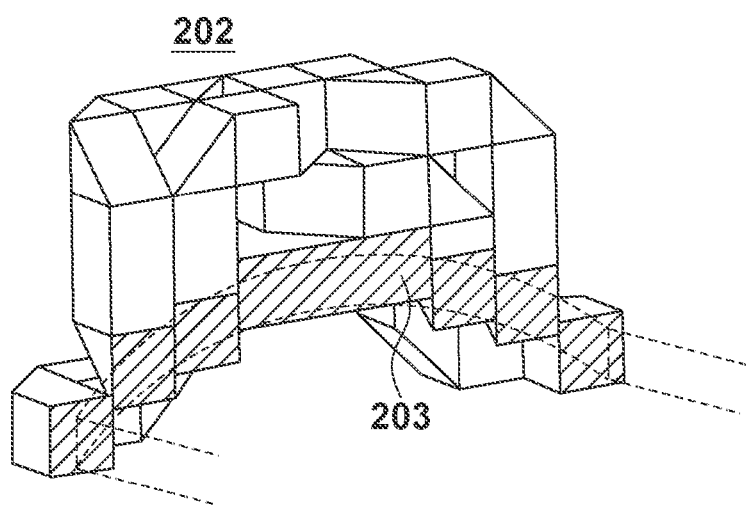

The configuration of an illumination optical system according to the third embodiment will be described with reference to FIG. 10. An illumination optical system 200 includes a light transmission unit 202, third rod optical system 207, enlarging optical system 240, slit 32, fourth optical system 33, and mask 34. The enlarging optical system 240 includes a second optical system 205, aperture stop 30, and third optical system 206. The enlarging optical system 240 enlarges, in the slit 32 at a position optically conjugate to that of the surface to be illuminated, the cross-sectional shape of the light beam emerging from the exit plane of the third rod optical system 207. A light beam emitted by a light source unit 50 is incident on an entrance plane (hatched portion) 201 of the light transmission unit 202, shown in FIG. 11A. The light beam is divided into seven light beams on the entrance plane 201 to allow the divided light beams to pass through different paths in the light transmission unit 202 for each divided region, thereby converting these light beams so that their cross-sectional shapes on an exit plane 203 are different from those on the entrance plane 201, as shown in FIG. 11B. In this embodiment, a joined pattern of light beams on the entrance plane 201 has a quadrangular cross-sectional shape, and a joined pattern of light beams on the exit plane 203 has a nearly arcuated cross-sectional shape, as shown in FIGS. 11A and 11B, respectively.

The light beam incident on the exit plane 203 of the third rod optical system 207 is reflected a plurality of times by its inner surface, and reaches an exit plane 204. The light beam emerging from the exit plane 204 of the third rod optical system 207 passes through the second optical system 205, aperture stop 30, and third optical system 206, and reaches the slit 32. The second optical system 205 is located so that the position of the aperture stop 30 substantially corresponds to the Fourier transform plane of the exit plane 204 of the third rod optical system 207. Also, the third optical system 206 is located so that the position of the slit 32 substantially corresponds to the Fourier transform plane of the aperture stop 30. At this time, the position of an exit plane 82 of the third rod optical system 207 and that of the slit 32 are optically conjugate to each other. Each optical element which constitutes the second optical system 205 and third optical system 206 is located so that the cross-sectional shape of the light beam on the exit plane 204 is enlarged in the slit 32 at a position optically conjugate to that of the surface to be illuminated.

In this embodiment, the arcuated cross-sectional shape of the light beam on the exit plane 204 is enlarged to twice and mapped on the slit 32. The light beam having passed through the slit 32 further passes through the fourth optical system 33, and reaches the mask 34 serving as a surface to be illuminated. The fourth optical system 33 is located so that the position of the slit 32 and that of the mask 34 are optically conjugate to each other. In this embodiment, the slit 32 having an arcuated opening, as shown in FIG. 5A, is used. This makes it possible to illuminate the arcuated region on the mask 34 at a position conjugate to that of the slit 32.

In this embodiment, in illuminating the mask 34 with a light beam emitted by the light source 12, the second rod optical system 19 and third rod optical system 207 are located to reduce an illuminance variation on the mask 34. To reduce the generated illuminance variation, it is necessary to increase the dimensions of the second rod optical system 19 and the third rod optical system 207 in the direction in which light travels. However, as in this embodiment, the dimensions of the second rod optical system 19 and the third rod optical system 207 in the direction in which light travels can be decreased by forming the second optical system 205 and the third optical system 207 so that the cross-sectional shape of the light beam on the exit plane 204 is enlarged in the slit 32.

The principle according to which the dimensions of the second rod optical system 19 and third rod optical system 207 in the direction in which light travels can be decreased by locating the enlarging optical system 240 will be explained below. FIG. 12A shows light transmitted through the interior of a quadrangular prismatic rod integrator having a length L and a cross-section with a side length d, and an alternate long and short dashed line indicates the optical axis. Assume herein that light travels from the initial end face of the quadrangular prismatic rod integrator while being tilted at an angle θ with respect to the optical axis. This light beam is reflected by the inner surface of the quadrangular prismatic rod integrator at a position corresponding to a length L/2, and reaches the terminal end face of this rod integrator, as shown in FIG. 12A. On the other hand, FIG. 12B shows light transmitted through the interior of a quadrangular prismatic rod integrator having a cross-section with a side length d/2. Assume herein that light travels from the initial end face of the quadrangular rod integrator while being tilted at an angle 2θ with respect to the optical axis. This light beam is reflected by the inner surface of the quadrangular prismatic rod integrator at a position corresponding to a length L/8, and subsequently repeats its reflection for every length L/4. This light beam is reflected four times by the inner surface of the rod integrator having the length L until it finally reaches the terminal end face of this rod integrator.

When a rod integrator is used to uniformize light, its dimension in the direction in which light travels is determined so that a light beam is reflected a plurality of times while it travels from its initial end face to its terminal end face. The larger the number of times of reflection, the greater the obtained uniformization effect becomes. Therefore, the uniformizationz effect is greater in the rod integrator shown in FIG. 12B than in that shown in FIG. 12A. In other words, to attain uniformization to the same degree as in FIG. 12A, a rod integrator having a length L/4 and a cross-section with a side length d/2, as shown in FIG. 12C, suffices. In the illumination optical system 200 according to this embodiment, the enlarging optical system 240 having a magnification of 2×is located downstream of the second rod optical system 19 and the third rod optical system 207. The Helmholtz-Lagrange invariant is maintained constant in the illumination optical system. Hence, the angle of light which passes through the second rod optical system 19 and the third rod optical system 207 with respect to the optical axis is twice, and the dimension of the cross-section of the rod integrator in one direction is ½ in the illumination optical system 200 with respect to an illumination optical system provided with no enlarging optical system 240. As can be seen from the details described with reference to FIGS. 12A to 12C, the use of the enlarging optical system 240 makes it possible to decrease the dimensions of the second rod optical system 19 and the third rod optical system 207 in the direction in which light travels to about ¼ while maintaining their uniformization effect.

The numbers and arrangements of optical elements which constitute the first optical system 17, second optical system 205, third optical system 206, and fourth optical system 33 in this embodiment merely provide an example, and the present invention is not limited to this. Also, although not particularly referred to in the above description, an antireflection film is formed on the light transmissive surface of each optical element, and a reflection film is formed on each mirror.

[Exposure Apparatus]

Figure 13:
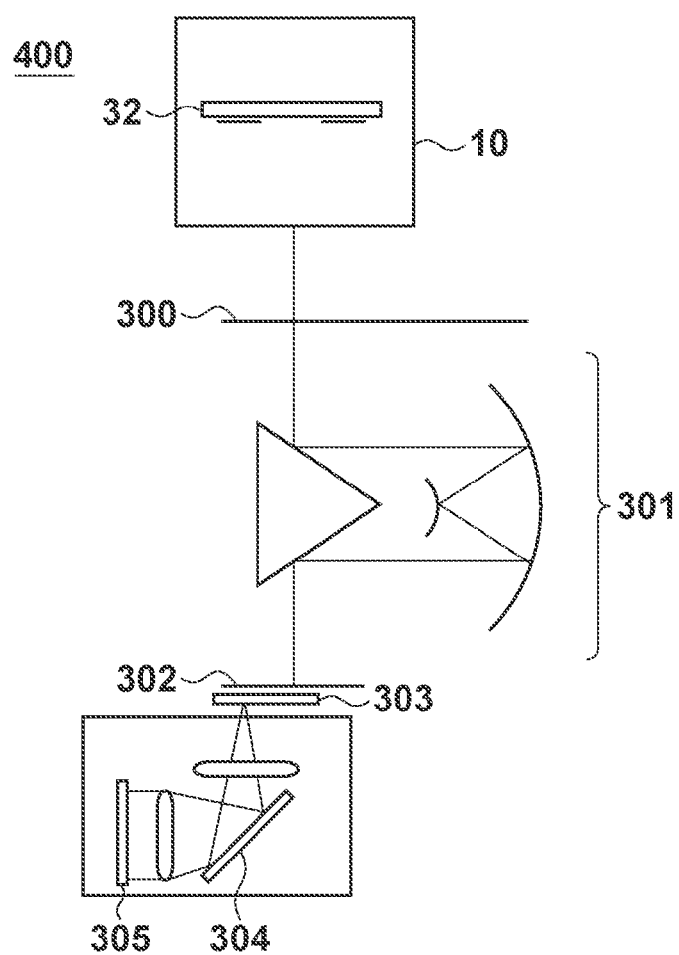
FIG. 13 is a schematic view of an exposure apparatus according to the fourth embodiment.

An example of an exposure apparatus will be described with reference to FIG. 13. An exposure apparatus 400 includes an illumination optical system 10, an original stage 300 which holds an original, a substrate stage 302 which holds a substrate, a projection optical system 301 which projects the pattern of the original onto the substrate, and an illuminance variation sensor 304, and exposes the substrate to light by synchronously scanning the original and the substrate. The projection optical system 301 can be, for example, a projection optical system including a first concave reflecting surface, convex reflecting surface, and second concave reflecting surface which are arranged in this order in the optical path from the object plane to the image plane. The illumination optical system 10 can also be substituted with the illumination optical system 100 or 200 described in the second or third embodiment. A slit 32 of the illumination optical system 10 has an arcuated opening, and has a structure with a slit width that can change for each arc position. The illuminance variation sensor 304 is formed by a slit 303, a plurality of optical elements, and a sensor 305, as shown in FIG. 13.

Figure 14:
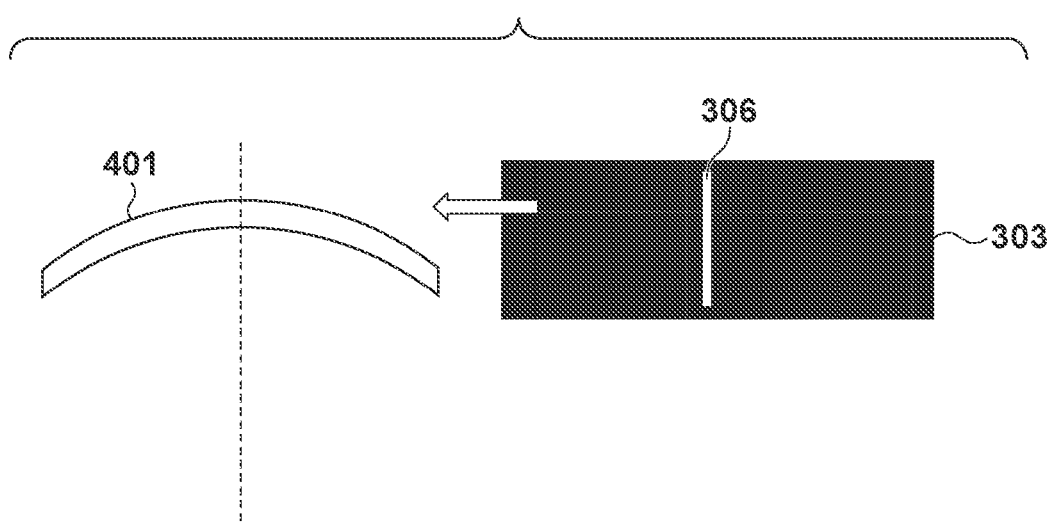
FIG. 14 is a view of slit scanning by an illuminance variation sensor.

The slit 303 is scanned with respect to a region 401 of light which forms an image on the substrate stage 302, as shown in FIG. 14. At this time, of the light which forms an image in the region 401, only a component which forms an image in an opening 306 of the slit 303 is incident on the illuminance variation sensor 304. The light incident on the illuminance variation sensor 304 is guided onto the sensor 305 by the plurality of optical elements, and reaches the sensor 305. The energy of light which reaches the sensor 305 is read while scanning the slit 303 in a direction indicated by an arrow in FIG. 14, the illuminance can be measured for each position in the region 401, thereby calculating an illuminance variation.

Figure 15A:
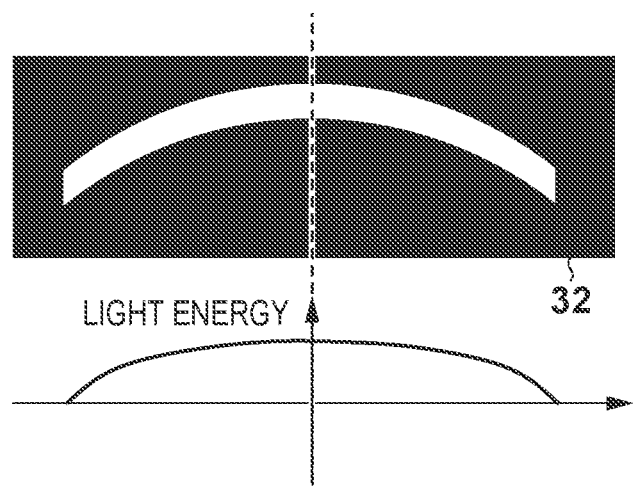
FIGS. 15A and 15B are views showing an illuminance variation correction method.
Figure 15B:
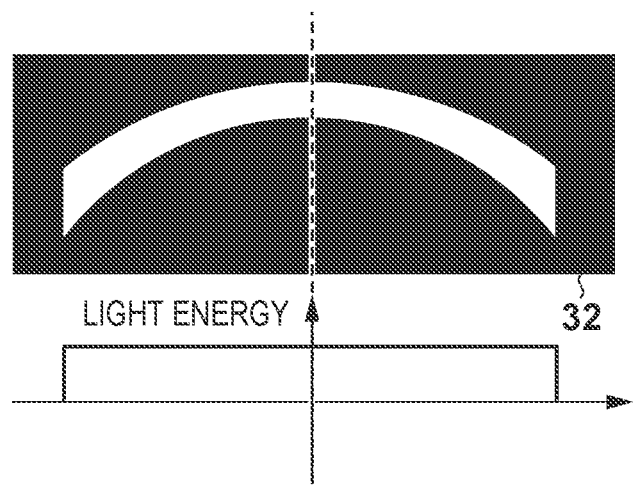
Figure 16:
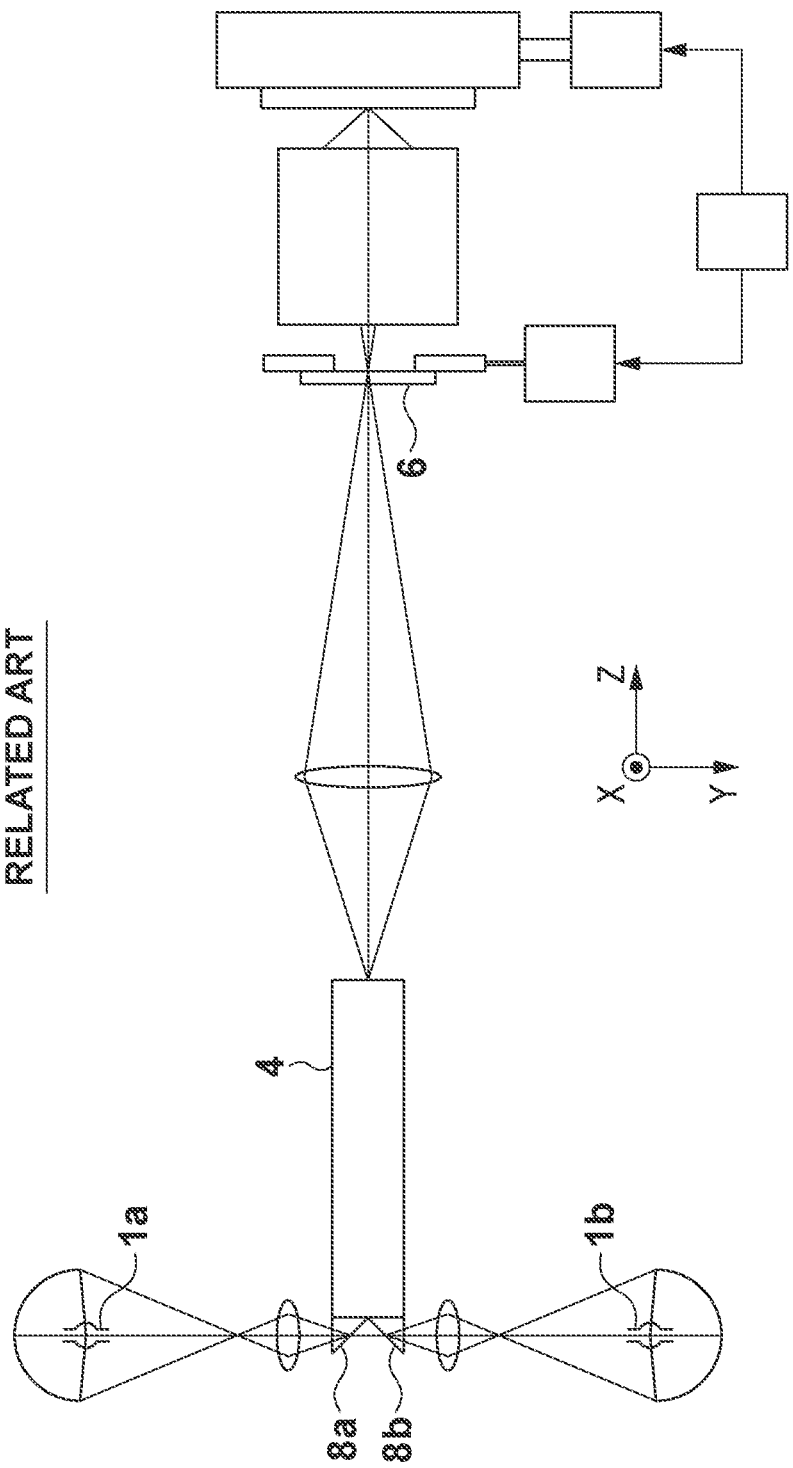
FIG. 16 is a schematic view of an illumination optical system according to the related art.

When an illuminance variation exists, it can be reduced by adjusting the opening width of the slit 32 having an adjustable shape. Assume, for example, that the illuminance variation sensor 304 measures an illuminance variation having an illuminance that is high at the center of the arc and decreases outwards along the arc, as shown in FIG. 15A. In this case, as shown in FIG. 15B, the slit shape is adjusted so that the opening width of the slit 32 increases outwards along the arc relative to the center of the arc, thereby maintaining the illuminance of light incident on the sensor 305 of the illuminance variation sensor 304 constant, independently of the position on the arc.

[Method of Manufacturing Device]

A method of manufacturing a device (for example, a semiconductor device or a liquid crystal display device) will be described next. A semiconductor device is manufactured by a pre-process of forming an integrated circuit on a wafer, and a post-process of completing, as a product, a chip of the integrated circuit formed on the wafer by the pre-process. The pre-process includes a step of exposing a wafer, coated with a photosensitive agent, using the above-mentioned exposure apparatus, and a step of developing the wafer. The post-process includes an assembly step (dicing and bonding) and packaging step (encapsulation). A liquid crystal display device is manufactured by a step of forming a transparent electrode. The step of forming a transparent electrode includes a step of coating a photosensitive agent on a glass substrate on which a transparent conductive film is deposited, a step of exposing the glass substrate, coated with the photosensitive agent, using the above-mentioned exposure apparatus, and a step of developing the glass substrate. The method of manufacturing a device according to this embodiment can manufacture a device with a quality higher than those of devices manufactured by the related art techniques.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-036334 filed Feb. 22, 2011, which is hereby incorporated by reference herein in its entirety.

What is claimed is:

1. An illumination optical system for illuminating a surface to be illuminated with a plurality of light beams emitted from a plurality of light sources, the illumination optical system comprising:

a plurality of rod integrators arranged respectively with the plurality of light sources, wherein the plurality of rod integrators uniformize a light intensity distribution of a light beam emitted from the plurality of light sources;

a combining optical system that combines the plurality of light beams emitted from said plurality of rod integrators, so that the plurality of light beams are adjacent to each other in cross-sections thereof; and a light transmission unit that has an entrance surface and an exit surface, divides the light beam combined by said combining optical system into a plurality of light beams on the entrance surface, joins the plurality of divided light beams so that a cross-sectional shape of a joined pattern of the plurality of divided light beams on the exit surface is different from a cross-sectional shape of a joined pattern of the plurality of divided light beams on the entrance surface, and transfers the plurality of divided light beams from the entrance surface to the exit surface using a plurality of optically coupled light pipes.

2. The system according to claim 1, further comprising a rod integrator that uniformizes a light intensity distribution of the light beam emitted from said combining optical system, and emits the light beam to said light transmission unit.

3. The system according to claim 1, wherein said light transmission unit is configured so that a region through which a light beam obtained by dividing a light beam from one light source, among the plurality of light sources, passes is positioned on the exit surface between regions through which two light beams obtained by dividing a light beam from another light source, among the plurality of light sources, pass.

4. The system according to claim 3, wherein said light transmission unit is configured so that the regions through which a light beam obtained by dividing a light beam from one light source, among the plurality of light sources, passes, and the region through which a light beam obtained by a light beam from another light source passes are arrayed alternately.

5. The system according to claim 1, wherein:
said light transmission unit comprises internal light transmission paths each including deflecting prisms and light pipes, and
the respective total number of deflecting prisms in the respective internal light transmission paths are equal, and the respective total number of light pipes in the respective internal light transmission paths are equal.

6. The system according to claim 1, further comprising:
an aperture stop located on a Fourier transform plane of the surface to be illuminated; and
a slit having an adjustable shape located at a position optically conjugate to a position of the surface to be illuminated.

7. An exposure apparatus comprising:
an illumination optical system for illuminating a surface to be illuminated with a plurality of light beams emitted from a plurality of light sources; and
a projection optical system that projects onto a substrate a pattern of an original illuminated by the illumination optical system to expose the substrate to light,
wherein the illumination optical system comprises:
a plurality of rod integrators arranged respectively with the plurality of light sources, wherein the plurality of rod integrators uniformize a light intensity distribution of a light beam emitted from the plurality of light sources;
a combining optical system that combines the plurality of light beams emitted from said plurality of rod integrators, so that the plurality of light beams are adjacent to each other in cross-sections thereof; and
a light transmission unit that has an entrance surface and an exit surface, divides the light beam combined by said combining optical system into a plurality of light beams on the entrance surface, joins the plurality of divided light beams so that a cross-sectional shape of a joined pattern of the plurality of divided light beams on the exit surface is different from a cross-sectional shape of a joined pattern of the plurality of divided light beams on the entrance surface, and transfers the plurality of divided light beams from the entrance surface to the exit surface using a plurality of optically coupled light pipes.

8. A method of manufacturing a device, the method comprising the steps of:
exposing a substrate to light using an exposure apparatus;
developing the exposed substrate; and
processing the developed substrate to manufacture the device,
wherein the exposure apparatus comprises:
an illumination optical system for illuminating a surface to be illuminated with a plurality of light beams emitted from a plurality of light sources; and
a projection optical system that projects a pattern of an original illuminated by the illumination optical system onto the substrate to expose the substrate to light,
wherein the illumination optical system comprises:
a plurality of rod integrators arranged respectively with the plurality of light sources, wherein the plurality of rod integrators uniformize a light intensity distribution of a light beam emitted from the plurality of light sources;
a combining optical system that combines the plurality of light beams emitted from said plurality of rod integrators, so that the plurality of light beams are adjacent to each other in cross-sections thereof; and
a light transmission unit that has an entrance surface and an exit surface, divides the light beam combined by said combining optical system into a plurality of light beams on the entrance surface, joins the plurality of divided light beams so that a cross-sectional shape of a joined pattern of the plurality of divided light beams on the exit surface is different from a cross-sectional shape of a joined pattern of the plurality of divided light beams on the entrance surface, and transfers the plurality of divided light beams from the entrance surface to the exit surface using a plurality of optically coupled light pipes.

9. An illumination optical system for illuminating a surface to be illuminated with a plurality of light beams emitted from a plurality of light sources, the illumination optical system comprising:
a plurality of first rod integrators arranged respectively with respect to the plurality of light sources, wherein the plurality of first rod integrators uniformize a light intensity distribution of a light beam emitted from the plurality of light sources;
an optical system that respectively guides the light beams from the plurality of first rod integrators; and
a second rod integrator that uniformizes a light intensity distribution of the light beam from the optical system,
wherein the optical system guides the light beams from the plurality of light sources to an entrance surface of the second rod integrator while displacing the light beams from each other.

10. An exposure apparatus comprising:
an illumination optical system for illuminating a surface to be illuminated with a plurality of light beams emitted from a plurality of light sources; and
a projection optical system that projects a pattern of an original illuminated by the illumination optical system onto a substrate to expose the substrate to light,
wherein the illumination optical system comprises:
a plurality of first rod integrators arranged respectively with respect to the plurality of light sources, wherein the plurality of first rod integrators uniformize a light intensity distribution of a light beam emitted from the plurality of light sources;
an optical system that respectively guides the light beams from the plurality of first rod integrators; and
a second rod integrator that uniformizes a light intensity distribution of the light beam from the optical system,
wherein the optical system guides the light beams from the plurality of light sources to an entrance surface of the second rod integrator while displacing the light beams from each other.

11. A method of manufacturing a device, the method comprising the steps of:
exposing a substrate to light using an exposure apparatus defined in claim 10;
developing the exposed substrate; and
processing the developed substrate to manufacture the device.

* * * * *